United States Patent
Kishimoto

(10) Patent No.: US 11,770,947 B2
(45) Date of Patent: Sep. 26, 2023

(54) DISPLAY COMPONENT, DISPLAY DEVICE AND MANUFACTURING METHOD THEREOF

(71) Applicant: SAMSUNG DISPLAY CO., LTD., Yongin-si (KR)

(72) Inventor: Hirotsugu Kishimoto, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 181 days.

(21) Appl. No.: 16/888,373

(22) Filed: May 29, 2020

(65) Prior Publication Data

US 2021/0043868 A1 Feb. 11, 2021

(30) Foreign Application Priority Data

Aug. 5, 2019 (KR) .......................... 10-2019-0094683

(51) Int. Cl.
*H10K 50/844* (2023.01)
*H10K 59/122* (2023.01)
*H10K 71/00* (2023.01)
*H10K 77/10* (2023.01)

(52) U.S. Cl.
CPC .......... *H10K 50/844* (2023.02); *H10K 59/122* (2023.02); *H10K 71/00* (2023.02); *H10K 77/111* (2023.02)

(58) Field of Classification Search
CPC ... H01L 51/5253–5256; H01L 51/0097; H01L 51/56; H01L 27/3246
See application file for complete search history.

(56) References Cited

U.S. PATENT DOCUMENTS

| | | | |
|---|---|---|---|
| 9,785,299 B2 | 10/2017 | Wickbolot et al. | |
| 10,414,869 B2 | 9/2019 | Jeong et al. | |
| 2016/0172427 A1* | 6/2016 | Lee | H01L 27/3279 257/40 |
| 2017/0075464 A1* | 3/2017 | Ahn | G06F 3/0412 |
| 2017/0323779 A1* | 11/2017 | Um | G02F 1/13454 |
| 2017/0352834 A1* | 12/2017 | Kim | H01L 51/0097 |
| 2017/0367173 A1* | 12/2017 | Park | G02F 1/133305 |
| 2018/0047938 A1* | 2/2018 | Kishimoto | H01L 51/5253 |
| 2018/0053817 A1 | 2/2018 | Kishimoto et al. | |
| 2019/0014669 A1* | 1/2019 | Ahn | H05K 1/144 |
| 2019/0146261 A1* | 5/2019 | Im | G02F 1/133305 349/106 |
| 2020/0388197 A1* | 12/2020 | Park | H01L 51/5256 |

FOREIGN PATENT DOCUMENTS

| | | |
|---|---|---|
| JP | 2015522451 | 8/2015 |
| KR | 20130080025 | 7/2013 |

* cited by examiner

*Primary Examiner* — Shaun M Campbell
(74) *Attorney, Agent, or Firm* — F. CHAU & ASSOCIATES, LLC

(57) ABSTRACT

A display device includes a substrate having a first surface, a second surface opposite to the first surface, a first non-bendable area, a second non-bendable area, and a bendable area, a display module disposed on the first surface of the substrate, a first protection film disposed on the second surface of the substrate to correspond to the first non-bending area, and a second protection film that differs from the first protection film disposed on the second surface of the substrate to correspond to the second non-bending area, where the first non-bendable area and the second non-bendable area are separated from each other with the bendable area in between.

5 Claims, 11 Drawing Sheets

DISPLAY COMPONENT, DISPLAY DEVICE AND MANUFACTURING METHOD THEREOF

CROSS-REFERENCE TO RELATED APPLICATIONS

This U.S. non-provisional patent Applications claims priority under 35 U.S.C. § 119 from, and the benefit of Korean Patent Application No. 10-2019-0094683, filed on Aug. 5, 2019 in the Korean Intellectual Property Office, the contents of which are herein incorporated by reference in their entirety.

BACKGROUND

Technical Field

Exemplary embodiments of the present invention are directed to a display device.

Discussion of the Related Art

Various display devices that are used in multi-media devices such as televisions, mobile phones, tablet computers, navigators, or game players, are being developed. A display device includes a display module disposed on a substrate. The substrate of the display device is electrically connected to a circuit board that provides driving signals.

Pads for electrical connection to the circuit board and other components are arranged in a non-display area on the substrate. When a display area is to be located on one entire surface of the display device, the non-display area on which the pads and other components are arranged should be minimized.

Nowadays, efforts to reduce the area of the non-display area of the display device are directed to bending a part of the substrate.

SUMMARY

Embodiments of the present disclosure provide a display device in which a part of a substrate is bendable, and a manufacturing method thereof.

Embodiments of the present disclosure also provide a display device in which a part of a substrate is bendable, and a display component applicable to the display device.

An exemplary embodiment of the inventive concept provides a display device that includes a substrate that includes a first surface, a second surface opposite to the first surface, a first non-bendable area, a second non-bendable area, and a bendable area; a display module disposed on the first surface of the substrate; a first protection film disposed on the second surface of the substrate and that corresponds to the first non-bendable area; and a second protection film disposed on the second surface of the substrate and that differs from the first protection film and that corresponds to the second non-bendable area, wherein the first non-bendable area and the second non-bendable area are separated from each other with the bendable area in between.

The first protection film may include glass.
The second protection film may include polyimide.
The first protection film may include a first adhesive layer and a first protection film base, and the first protection film base may be attached to the second surface of the substrate by the first adhesive layer.

The second protection film may include a second adhesive layer and a second protection film base, and the second protection film base may be attached to the second surface of the substrate by the second adhesive layer.

The first adhesive layer and the second adhesive layer may include an identical material.

Another exemplary embodiment of the present invention provides a display component that includes a first liner that includes a first area and a second area separate front the first area by a predetermined distance; a first adhesive layer disposed on the first area of the first liner; a second adhesive layer disposed on the second area of the first liner; and a second liner disposed on the first adhesive layer and the second adhesive layer.

The first liner may be removable from the first adhesive layer and the second adhesive layer.

The second liner may be removable front the first adhesive layer and the second adhesive layer.

The first adhesive layer and the second adhesive layer may include an identical material.

Another exemplary embodiment of the present invention provides a display component that includes a first liner that includes a first area and a second area separate from the first area by a predetermined distance; a first adhesive layer disposed on the first area of the first liner; a second adhesive layer disposal on the second area of the first finer; a second liner disposed on the first adhesive layer; and a protection film disposed on the second adhesive layer.

The display component may further include a carrier film disposed on the second liner and the second adhesive layer.

The carrier film may be removable from the second liner and the second adhesive layer.

The first liner may be removable from the first adhesive layer and the second adhesive layer.

The second liner may be removable from the first adhesive layer.

According to an exemplary embodiment, a method of manufacturing a display device includes providing a display panel that includes a first non-bendable area, a second non-bendable area, and a bendable area; disposing a first adhesive layer on a second surface of the display panel at a position that corresponds to the first non-bendable area, and disposing a second adhesive layer on the second surface of the display panel at a position that corresponds to the second non-bendable area; and disposing a first protection film base on the first adhesive layer, and disposing a second protection film base that differs from the first protection film base, on the second adhesive layer, wherein the first non-bendable area and the second non-bendable area are separated from each other with the bendable area in between.

The first protection film base may include glass.
The second protection film base may include polyimide
Disposing the first adhesive layer and disposing the second adhesive layer may include: providing a display device component that includes a first liner that includes a first area and a second area separate from the first area by a predetermined distance, a first adhesive layer disposed on the first area of the first liner, a second adhesive layer disposed on the second area of the first liner, and a second liner disposed on the first adhesive layer and the second adhesive layer; removing the first liner of the display device component; attaching the first adhesive layer and the second adhesive layer to the second surface of the display panel; and removing the second liner of the display device component.

The first adhesive layer and the second adhesive layer may include an identical material.

DETAILED DESCRIPTION

Figure 1:
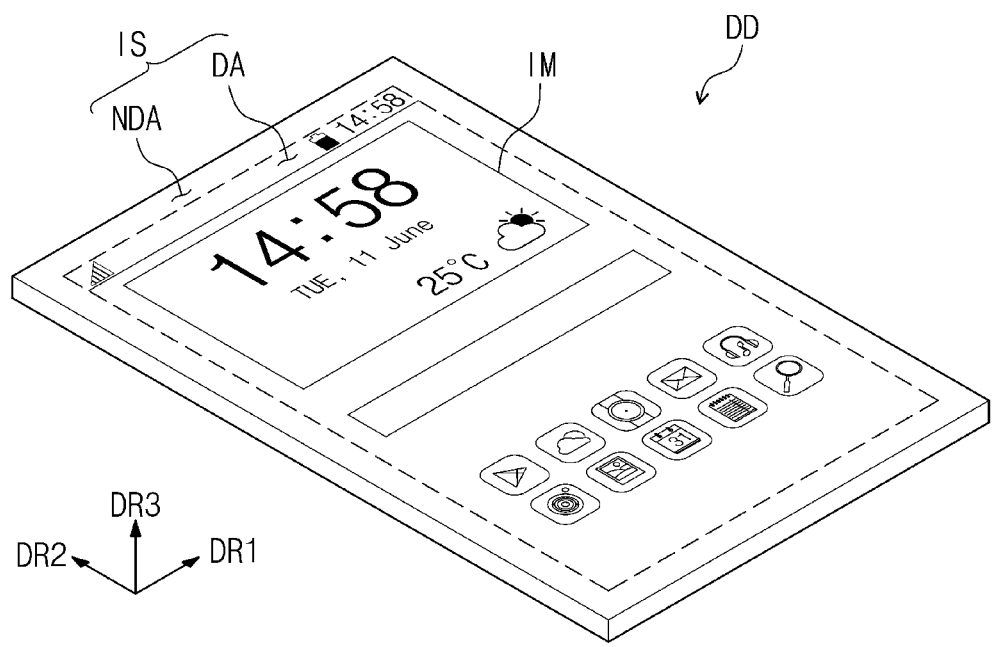
FIG. 1 is a perspective view of a display device according to an embodiment of the inventive concept.

It will be understood that when an element or layer is referred to as being "on", "to" or "coupled to" another element or layer, it can be directly on, connected or coupled to the other element or intervening third elements may be present.

Like reference numerals in the drawings may refer to like elements. In addition, in the drawings, the thickness and the ratio and the dimension of the element may be exaggerated for effective description of the technical contents.

Hereinafter, embodiments of the inventive concept will be described with reference to the accompanying drawings.

FIG. 1 is a perspective view of a display device DD according to an embodiment of the inventive concept.

Referring to FIG. 1, the display device DD may be a liquid crystal display device, a field emission display device, a plasma display device, or an inorganic light emitting display device. However, embodiments are not limited thereto, and the display device DD is not limited to these types of the enumerated display devices.

According to an embodiment, FIG. 1 illustrates a flat display device as an example of the display device DD. However, embodiments are not limited thereto, and in other embodiments, the display device DD may be a foldable display device, a reliable display device, or a bended display device. The display device DD can be used in a medium or small-sized electronic device such as a mobile phone, a tablet computer, a vehicle navigator, a game device, or a smart watch as well as a large-sized electronic device such as a television or a monitor.

According to an embodiment, the display device DD is parallel to the surface defined by a first directional axis DR1 and a second directional axis DR2, and includes a display surface IS on which an image IM can be displayed. The display surface IS of the display device DD includes a plurality of areas. The display device DD includes a display area DA on which the image IM is displayed and a non-display area NDA adjacent to the display area DA. The non-display area NDA is an area in which an image is not displayed.

For example, according to an embodiment, the display area DA has a rectangular shape. The non-display area NDA surrounds the display area DA. However, embodiments are not limited thereto, and the display area DA and the non-display area NDA may have other shapes in other embodiments.

According to an embodiment, the normal direction of the display surface IS, namely the thickness direction of the display device DD, is indicated by a third directional axis DR3. The first (or top) surface and the second (or bottom) surface of each member is separated in the third directional axis DR3. However, the directions indicated by the first to third directional axes DR1, DR2, and DR3 are relative and may be transformed into other directions. Hereinafter, the first to third directions refer to the directions respectively indicated by the first to third directional axes DR1, DR2, and DR3.

Figure 2:
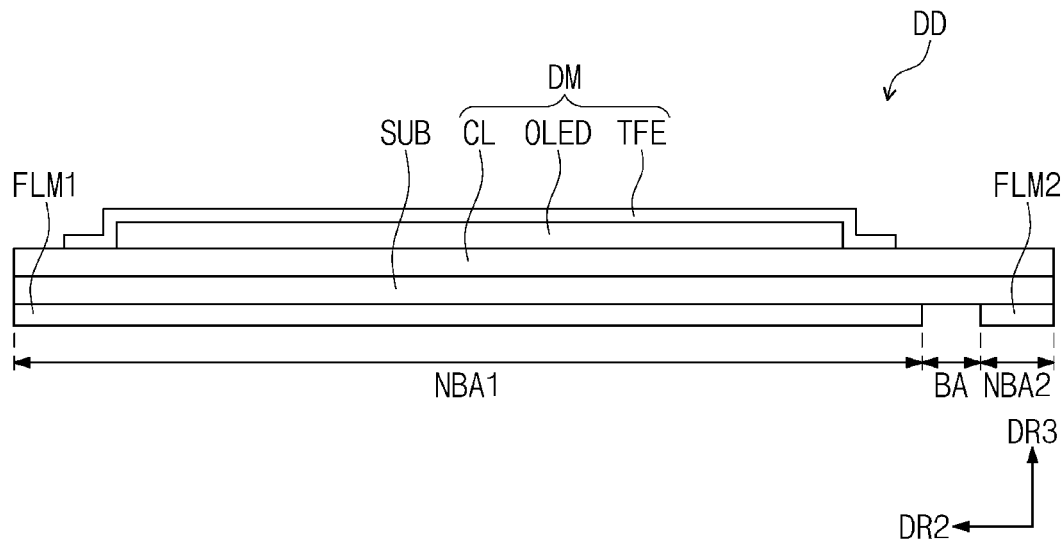
FIG. 2 is a cross-sectional view of a display device according to an embodiment of the inventive concept.

FIG. 2 is a cross-sectional view of the display device DD according to an embodiment of the inventive concept. FIG. 2 illustrates a cross section defined by the second directional axis DR2 and the third directional axis DR3.

As illustrated in FIG. 2, according to an embodiment, the display device DD includes a substrate SUB and a display module DM. The display device DD according to an embodiment of the inventive concept further includes a first protection film FLM1 and a second protection film FLM2 disposed on the bottom surface of the substrate SUB. In addition, the display device DD further includes a reflection prevention member or a window member disposed on the top surface of the display module DM. In another embodiment, the display device DD further includes an input sensing unit between the top surface of the display module DM and the window member to sense a touch input of a user.

According to an embodiment, the display module DM is an emissive display panel, but embodiments are not particularly limited thereto. In other embodiments, the display module DM may be an organic emissive display panel or a quantum dot emissive display panel. In an organic emissive display panel, a light emission layer includes an organic light emission material. In a quantum dot emissive display panel, a light emission layer includes a quantum dot and a quantum rod. Hereinafter, the display module DM will be described as an organic emissive display panel.

According to an embodiment, the substrate SUB includes at least one plastic film. As a flexible substrate, the substrate SUB may be a plastic substrate, a glass substrate, a metal substrate, an organic/inorganic composite material substrate, etc. The display area DA and the non-display area NDA described with respect to FIG. 1 are defined identically on the substrate SUB.

On the other hand, according to an embodiment, the substrate SUB includes at least one non-bendable area and a bendable area BA. In an exemplary embodiment, the substrate SUB includes one bendable area BA and two non-bendable areas, namely, a first non-bendable area NBA1 and a second bendable area NBA2, but embodiments of the inventive concept are not limited thereto. In other embodiments, the substrate SUB includes two or more bendable areas and three or more non-bendable areas.

According to an embodiment, the first non-bendable area NBA1 and the second non-bendable area NBA2 are separately disposed from each other in the second directional axis DR2, and the bendable area BA is disposed between the first non-bendable area NBA1 and the second non-bendable area NBA2. In other words, the first non-bendable area NBA1 and the second non-bendable area NBA2 are separately disposed with the bendable area BA therebetween.

According to an embodiment, the display module DM is disposed on the top (or first) surface of the substrate SUB. The display module DM includes a circuit element layer CL, a light emitting element OLED, and a thin-film encapsulation layer TFE. The light emitting element OLED and the thin-film encapsulation layer TFE correspond to the first non-bendable area NBA1. In addition, the display module DM further includes functional layers such as a reflection protection layer or a refractive index adjustment layer.

According to an embodiment, the circuit element layer CL includes at least one intermediate insulation layer and a circuit element. The intermediate insulation layer includes at least one intermediate inorganic film and at least one intermediate organic film. The circuit element includes signal lines and a pixel driving circuit, etc. Detailed descriptions thereabout will be provided below.

According to an embodiment, the light emitting element OLED includes at least organic light emitting diode. The light emitting element OLED further includes an organic film such as a pixel definition film.

According to an embodiment, the thin film encapsulation layer TFE encapsulates the light emitting element OLED. The thin-film encapsulation layer TFE includes at least one inorganic film, hereinafter referred to as an inorganic encapsulation film. The thin-film encapsulation layer TFE further includes at least one organic film, hereinafter referred to as an organic encapsulation film. The inorganic encapsulation film protects the light emitting element OLED from moisture and oxygen, and the organic encapsulation layer protects the light emitting element OLED from foreign matter such as dust particles. The inorganic encapsulation film includes one or more of a silicon nitride layer, a silicon oxy-nitride layer, a silicon oxide layer, a titanium oxide layer, or an aluminum oxide layer, etc. The organic encapsulation film includes an acrylic-based inorganic layer, but embodiments are not limited thereto.

According to an embodiment, the first protection film FLM1 and the second protection film FLM2 are attached to the bottom (or second) surface of the substrate SUB. The first protection film FLM1 and the second protection film FLM2 prevent external foreign matter such as moisture or oxygen from permeating into the light emitting element OLED, and protect the light emitting element OLED from an external shock. The first protection film FLM1 is disposed in the first non-bendable area NBA1 of the substrate SUB, and the second protection film FLM2 is disposed in the second non-bendable area NBA2 of the substrate SUB In other words, the first protection film FLM1 and the second protection film FLM2 are disposed separate from each other in the second direction DR2 with the bendable area BA therebetween.

In an exemplary embodiment, the first protection film FLM1 is substantially as long as the first non-bendable area NBA1 in the second directional axis DR2. and the second protection film FLM2 is substantially as long as the second non-bendable area NBA2 in the second directional axis DR2, but embodiments of the inventive concept are not limited thereto. In other words, the length of the first protection film FLM1 in the second directional axis DR2 may be greater or less than that of the first non-bendable area NBA1. In addition, the length of the second protection film FLM2 in the second directional axis DR2 may be greater or less than that of the second non-bendable area NBA2.

In an exemplary embodiment, the first protection film FLM1 and the second protection film FLM2 are composed of different materials. For example, the first protection film FLM1 is composed of glass, and the second protection film FLM2 is composed of polyimide (PI). In particular, the first protection film FLM1 is composed of an ultra-thin glass with a thickness of 0.1 mm or less.

Figure 3:
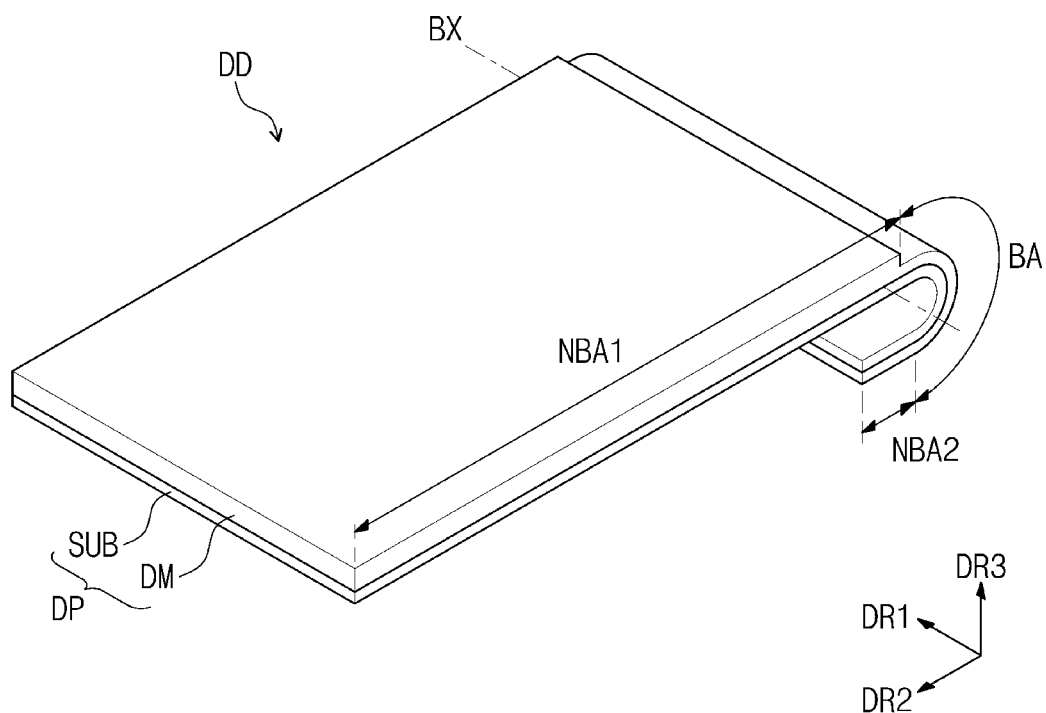
FIG. 3 is a perspective view of a part of a display device according to an embodiment of the inventive concept.

FIG. 3 is a perspective view of a part of a display device according to an embodiment of the inventive concept.

With reference to FIG. 3, according to an embodiment, the substrate SUB of the display device DD and a part of the display module DM are bent about a bending axis BX. The substrate SUB includes one or more of various flexible or bendable materials, such as a polymer resin such as polyethersulphone (PES), polyacrylate (PAR), polyetherimide (PEI), polyethyelenennapthalate (PEN), polyethyelene-terepthalate (PET), polyphenylenesulfide (PPS), polyallylate, polyimide (PI), polycarbonate (PC), or cellulose acetate propionate (CAP).

Hereinafter, the display module DM and the substrate SUB are referred to as the display panel DP.

Figure 4:
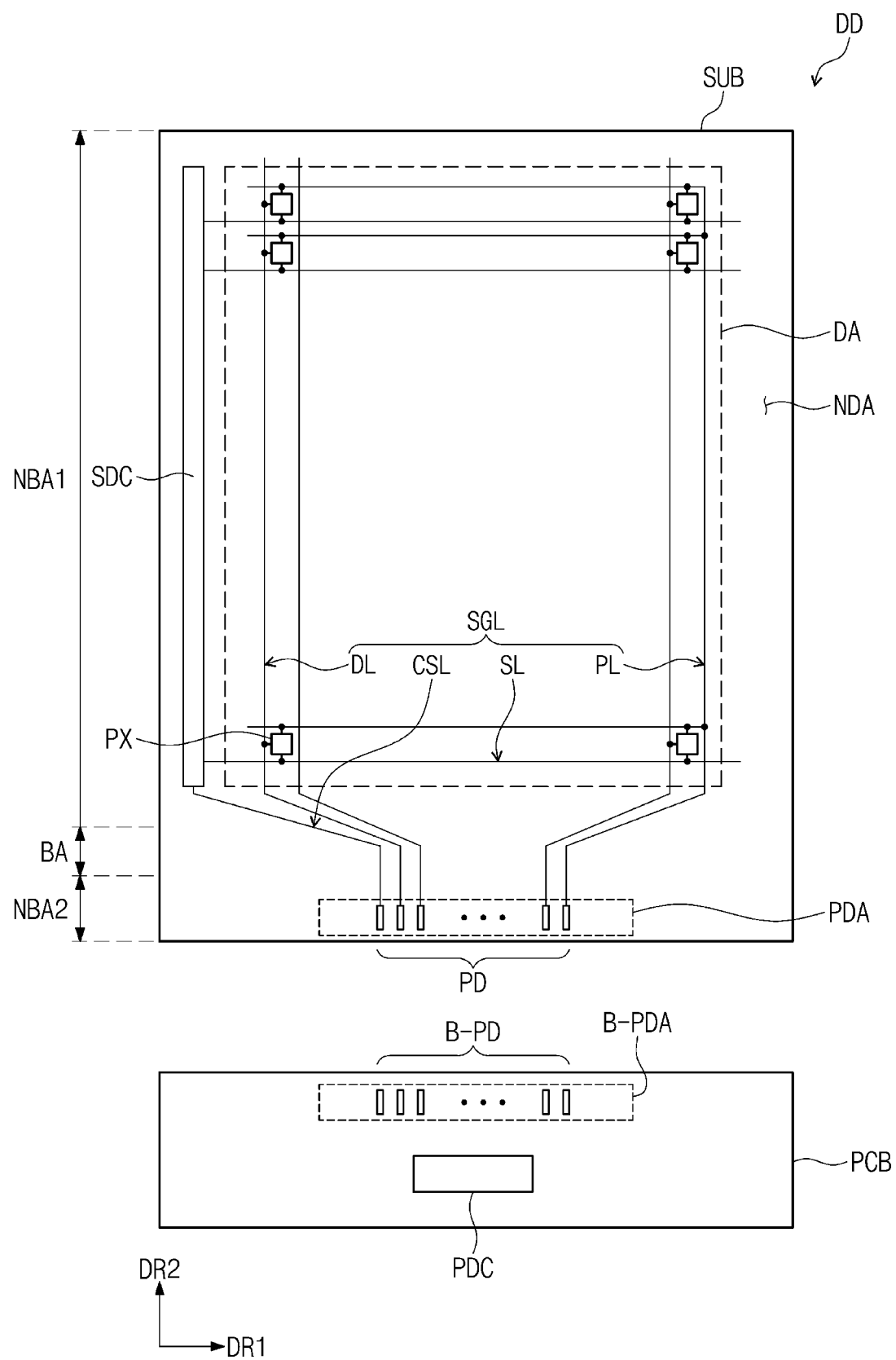
FIG. 4 is a plan view of a display unit according to an embodiment of the inventive concept.

FIG. 4 is a plan view of a display device in a plane defined by the first and second directions DR1, DR2, according to an embodiment of the inventive concept. In addition, for convenience of explanation, some elements are omitted in FIG. 4.

As illustrated in FIG. 4, according to an embodiment, the display device DD includes the display area DA and the non-display area NDA on a plane. The non-display area NDA is located on the outskirts of the display area DA along the bezel of the display area DA.

According to an embodiment, the display device DD includes a scan driving circuit SDC, a plurality of signal lines GSL, a plurality of pads PD, and a plurality of pixels PX formed on the substrate SUB. The pixels PX are disposed in the display area DA. Each of the pixels PX includes an organic light emitting diode and a pixel driving circuit connected thereto.

According to an embodiment, the scan driving circuit SDC generates a plurality of scan signals, and sequentially outputs the scan signals to a plurality of scan lines SL to be described below. The scan driving circuit further outputs other control signals to the driving circuits of the pixels PX.

According to an embodiment, the scan driving circuit SDC includes a plurality of thin-film transistors formed through the same processes as those that form the pixel driving circuits, such as a low temperature polycrystalline silicon (LTPS) process or a low temperature polycrystalline oxide process (LTPO) process.

According to an embodiment, the signal lines SGL include a plurality of scan lines SL, a plurality of data lines DL, a power line PL, and a control signal line CSL. The scan lines SL are respectively connected to corresponding pixels PX, and the data lines DL are respectively connected to corresponding pixels PX. The power line PL is connected to the pixels PX. The control signal line CSL provides control signals to the scan driving circuit SDC.

According to an embodiment, the signal lines SGL overlap the display area DA and the non-display area NDA. The signal lines SGL include a pad unit and a line unit. The line unit overlaps the display area DA and the non-display area NDA. The pad unit is connected to a terminal end of the line unit. The pad unit is disposed in the non-display area NDA, and overlaps a corresponding pad of the plurality of pads PD. An area in which the pads PD are disposed in the non-display area is referred to as a pad area PDA.

According to an embodiment, the line unit connected to the pixels PX forms substantially most of the signal lines SGL. The line unit is connected to transistors of the pixels PX. The line unit may have a single layer or a multi-layer structure, and the line unit may have a single body or two or more parts. The two or more parts may be disposed on different layers, and may be connected to each other through a contact hole that penetrates an insulation layer disposed between the two or more parts.

According to an embodiment, the substrate SUB includes the first non-bendable area NBA1, the second non-bendable area NBA2, and the bendable area BA. The first non-bendable area NBA1 and the second non-bendable area NBA2 are disposed separately from each other in the second directional axis DR2, and the bendable area BA is disposed between the first non-bendable area NBA1 and the second non-bendable area NBA2.

According to an embodiment, the first non-bendable area NBA1 corresponds to the display area DA, and the second non-bendable area NBA2 corresponds to the pad area PDA. In an exemplary embodiment, the first non-bendable area NBA1 is longer in the second directional axis DR2 direction than the display area DA, and the second non-bendable area NBA2 is longer in the second directional axis DR2 direction than the pad area PDA. However, embodiments of the present inventive concept are not limited thereto.

According to an embodiment, FIG. 4 additionally illustrates a printed circuit board (PCB) electrically connected to the display device DD. The printed circuit board PCB may be a rigid circuit board or a flexible circuit board. The printed circuit board PCB may be directly connected to the display device DD, or may be connected to the display device DD through another circuit board.

According to an embodiment, a panel driving circuit PDC that controls an operation of the display device DD is disposed on the primed circuit board PCB. In addition, a plurality of passive elements are further disposed on the printed circuit board PCB. The panel driving circuit PDC is mounted on the printed circuit board PCB as an integrated chip. The printed circuit board PCB also includes board pads B-PD electrically connected to the pads PD of the display device DD. The board pads B-PD are disposed in a board pad area B-PD A. The printed circuit board PCB further includes signal lines that connect the board pads B-PD and the panel driving circuit PDC.

Figure 5:
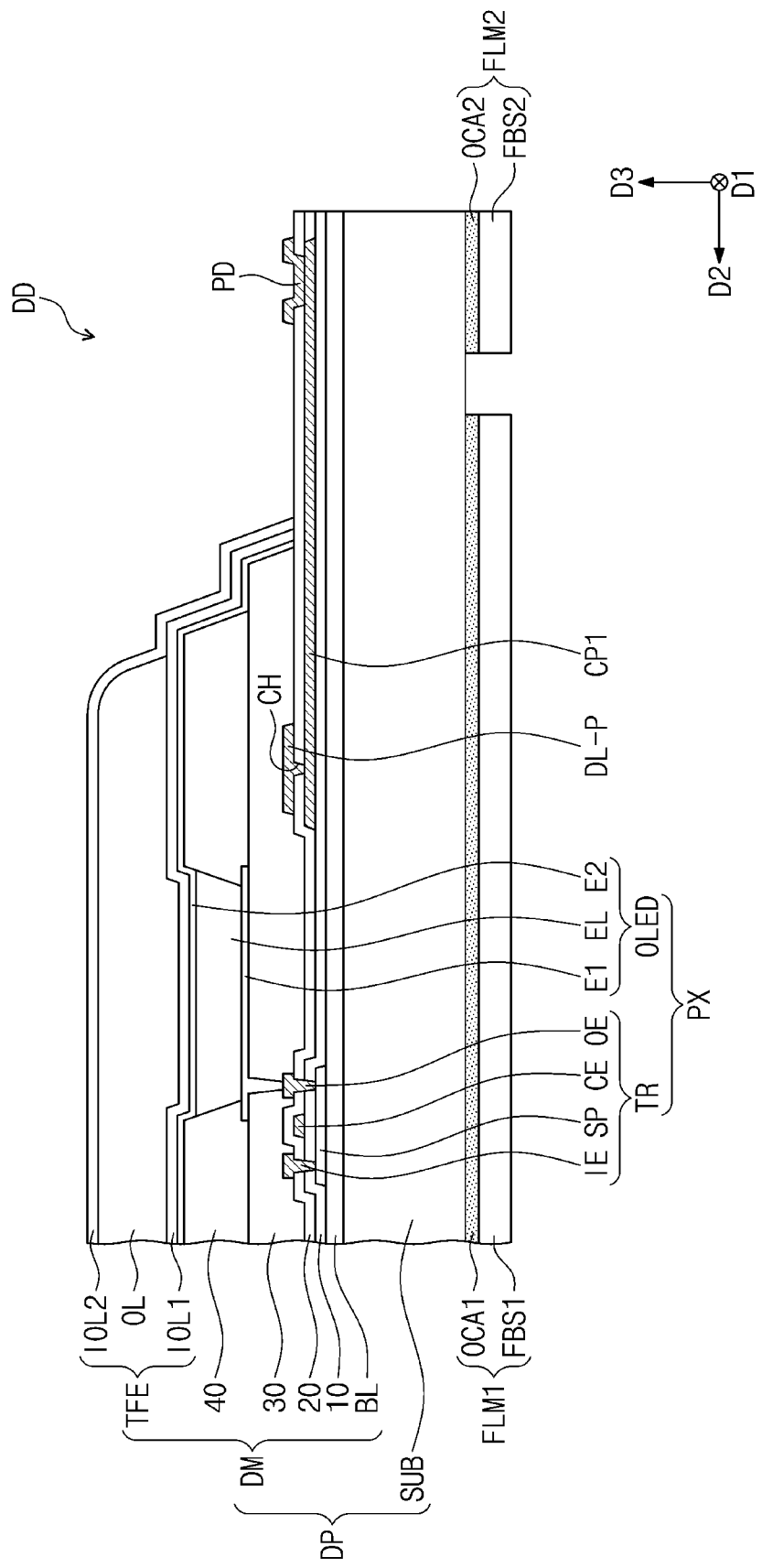
FIG. 5 is a partial cross section of the display device that corresponds to one pixel and one pad illustrated in FIG. 4.

FIG. 5 is a partial cross section of a display device that corresponds to one pixel and one pad illustrated in FIG. 4.

With reference to FIGS. 4 and 5, according to an embodiment, the substrate SUB is an insulation substrate. For example, the substrate SUB may be a plastic substrate or a glass substrate. The display module DM includes an auxiliary layer BL and first to fourth insulation layers 10, 20, 30, and 40. The auxiliary layer BL is disposed on the substrate SUB and covers the front surface of the substrate SUB. The auxiliary layer BL includes an inorganic material. The auxiliary layer BL includes a barrier layer or a buffer layer. Accordingly, the auxiliary layer BL can prevent oxygen or moisture coming in through the substrate SUB from permeating into the pixel PX. In addition, the auxiliary layer BL enhances a binding force between the substrate SUB and the conductive patterns or the semiconductor patterns. Each of the first to fourth insulation layers 10, 20, 30, and 40 may include an organic material or an inorganic material, and may have a single layer structure or a laminated structure.

According to an embodiment, the pixel PX is disposed on the display area DA. In a present embodiment, the pixel PX includes one transistor TR and the light emitting element OLED, but embodiments of the inventive concept are not limited thereto. For example, in other embodiments, one pixel PX may include two or more transistors.

According to an embodiment, the transistor TR is disposed on the substrate SUB, and includes a control electrode CE, an input electrode IE, an output electrode OE, and a semiconductor pattern SP. The first insulating layer 10 is disposed on the auxiliary layer BL and covers the semiconductor pattern SP. The control electrode CE is separated from the semiconductor pattern SP with the first insulation layer 10 therebetween. The second insulation layer 20 is disposed on the first insulation layer 10 and covers the control electrode CE. Each of the input electrode IE and the output electrode OE is disposed on the second insulation layer 20 and penetrates through the first insulation layer 10 and the second insulation layer 20, and is then connected to the semiconductor pattern SP. The output electrode OE is connected to the light emitting element OLED. The third insulating layer 30 is disposed on the second insulating layer 20 and covers the input and output electrodes IE, OE.

According to an embodiment, the light emitting element OLED includes a first electrode E1, an emission layer EL, and a second electrode E2. The first electrode E1 is disposed on the third insulation layer 30, and penetrates through the third insulation layer 30 to connect to the transistor TR. The fourth insulating layer 40 is disposed on the third insulating layer 30 and covers an edge portion of the first electrode E1, exposing a center portion of the first electrode E1. The emission layer EL covers the center portion of the first electrode E1 exposed by the fourth insulation layer 40. The emission layer EL includes a light emitting material that generates light in correspondence to a potential difference. For example, the emission layer EL may include an organic light emitting material or a quantum dot. The second electrode E2 is disposed on the emission layer EL and the fourth insulating layer 40. The second electrode E2 is formed on the front surface of the display area DA.

According to an embodiment, the light emitting element OLED generates and emits light corresponding to a potential difference between a data signal provided to the first electrode E1 through the transistor TR and a power supply voltage, such as a ground voltage, provided to the second electrode E2.

According to an embodiment, a conductive pattern CP1 connects the data lines DL and the pad PD. The conductive pattern CP1 includes a plurality of line patterns that extend along the second direction D2 and are separated from each other along the first direction D1.

In a present embodiment, the conductive pattern CP1 is disposed on a different layer from the data lines DL. For example, the conductive pattern CP1 is disposed on the same layer as the control electrode CE and the gate lines GL. Here, a data line connection terminal DL-P extends from the data lines DL and is connected to the conductive pattern CP1 disposed between the first insulation layer 10 awl the second insulation layer 20 through a contact hole CH formed in the second insulation layer 20.

However, embodiments are not limited to the above-described example, and in other embodiments, the conductive pattern CP1 is disposed on the same layer as the data lines DL. For example, the conductive pattern CP1 can be integrally formal with the data lines DL to be provided as a part of the data lines DL, or can be respectively connected to the data lines DL through a separate bridge pattern, etc. When connected to the data lines DL, the conductive pattern CP1 according to an embodiment of the inventive concept can be provided in various types, and is not limited to any one embodiment.

According to an embodiment, the encapsulation layer TFE is disposed on the fourth insulation layer 40 and encapsulates the light emitting element OLED. The encapsulation layer TFE includes a first inorganic film IOL1, an organic film OL, and a second inorganic film IOL2 sequentially laminated in the third direction D3. However, embodiments are not limited to this example, and in other embodiments, the encapsulation layer TFE may further include an inorganic film and an organic film, or at least any one of the first inorganic film IOL1. the organic film OL, and the second inorganic film IOL2 may be omitted. In a present embodiment, the organic film OL extends into an area in which the scan driving circuit SDC is disposed.

According to an embodiment, the pad PD is connected to the conductive pattern CP1. In an exemplary embodiment, the pad PD is a data pad that transmits a data signal received from the printed circuit board PCB to the data lines DL.

In a present embodiment, the pad PD is disposed on a different layer from the conductive pattern CP1. For example, the pad PD is disposed on the second insulation layer 20 and penetrates through the second insulation layer 20 to connect to the conductive pattern CP1. However, embodiments are not limited to this example, and in other embodiments, the pad PD is disposed on the same layer as the conductive pattern CP1, and integrally formed with the conductive pattern CP1.

According to an embodiment, the display device DD further includes the first protection film FLM1 and the second protection film FLM2 disposed on the bottom surface of the substrate SUB. The first protection film FLM1 includes a first adhesive layer OCA1 and a first protection film base FBS1. The first protection film base FBS1 is attached to the bottom surface of the substrate SUB by the first adhesive layer OCA1. The second protection film FLM2 includes a second adhesive layer OCA2 and a second protection film base FBS2. The second protection film base FBS2 is attached to the bottom surface of the substrate SUB by the second adhesive layer OCA2.

FIGS. 6A to 6F illustrate processes for attaching the first protection film FLM1 and the second protection film FLM2 to the display panel DP.

Figure 6A:
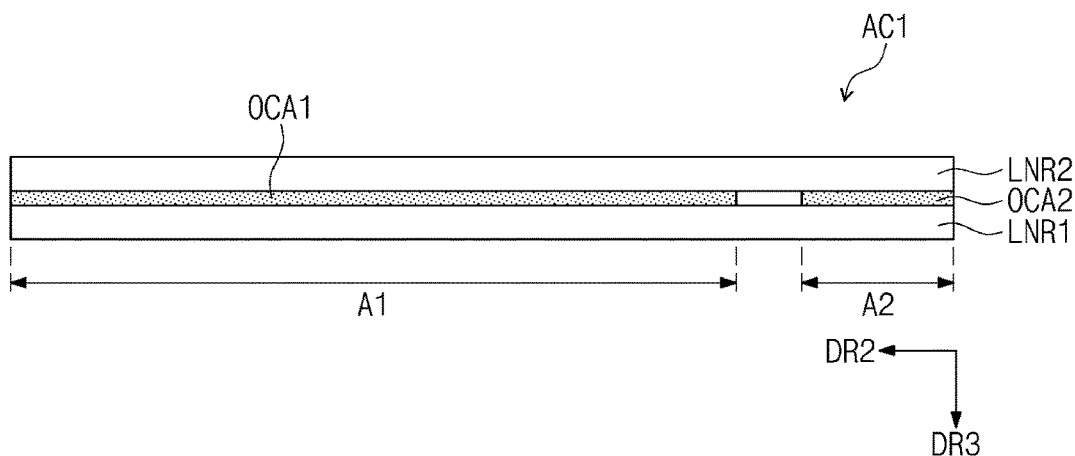
FIGS. 6A to 6F illustrate processes for attaching a first protection film and a second protection film to a display panel.

With reference to FIG. 6A, according to an embodiment, an adhesive component AC1, which is a display component, includes a first liner LNR1, a second liner LNR2, the first adhesive layer OCA1 and a second adhesive layer OCA2.

According to an embodiment, the first liner LNR1 includes a first area A1 and a second area A2 that is separated from the first area A1 by a predetermined distance in the second direction DR2 The first area A1 corresponds to the first non-bendable area NBA1 illustrated in FIG. 6, and the second area A2 corresponds to the second non-bendable area NBA2 illustrated in FIG. 6.

According to an embodiment, the first adhesive layer OCA1 is disposed on the first area A1 on the first liner LNR1. The second adhesive layer OCA2 is disposed on the second area A2 on the first liner LNR1.

According to an embodiment, the second liner LNR2 is disposed on the first adhesive OCA1 and the second adhesive layer OCA2.

According to an embodiment, the first liner LNR1 and the second liner LNR2 respectively prevent damage to the first adhesive layer OCA1 and the second adhesive layer OCA2 in a manufacturing process, and are carrier films that facilitate handling during the manufacturing process. Since the first liner LNR1 and the second liner LNR2 are removed in the manufacturing process, the adhesive forces between the first liner LNR1, the first adhesive layer OCA1 and the second adhesive layer OCA2, and the second liner LNR2 are not strong.

Figure 6B:
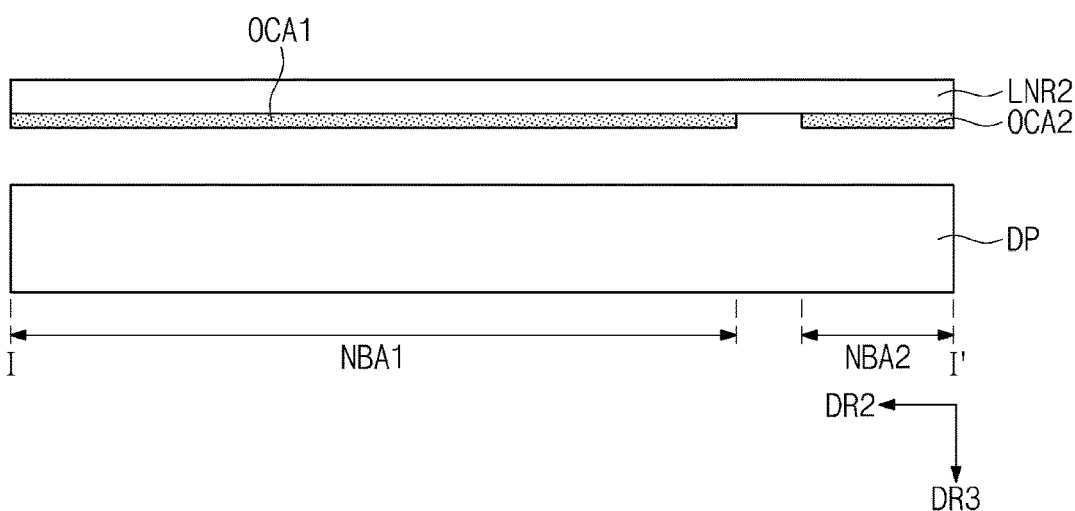

According to an embodiment, FIG. 6B illustrates a state in which the first liner LNR1 is removed from the first adhesive layer OCA1 and the second adhesive layer OCA2 to attach the first adhesive layer OCA1 and the second adhesive layer OCA2 to the display panel DP. The first adhesive layer OCA1 and the second adhesive layer OCA2 are aligned to respectively correspond to the first non-bendable area NBA1 and the second non-bendable area NBA2 of the display panel DP.

As described with regard to FIGS. 3 to 5, the display panel DP includes the substrate SUB and the display module DM.

Figure 6C:
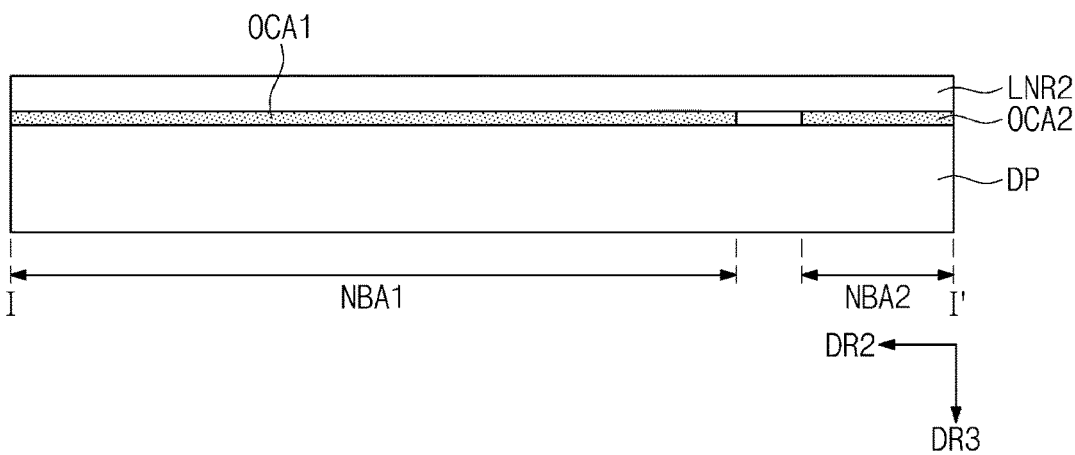

According to an embodiment, FIG. 6C illustrates a state in which the first adhesive layer OCA1 and the second adhesive layer OCA2 are attached to the display panel DP. The first adhesive layer OCA1 and the second adhesive layer OCA2 respectively correspond to the first non-bendable area NBA1 and the second non-bendable area NBA2 of the display panel DP.

Figure 6D:
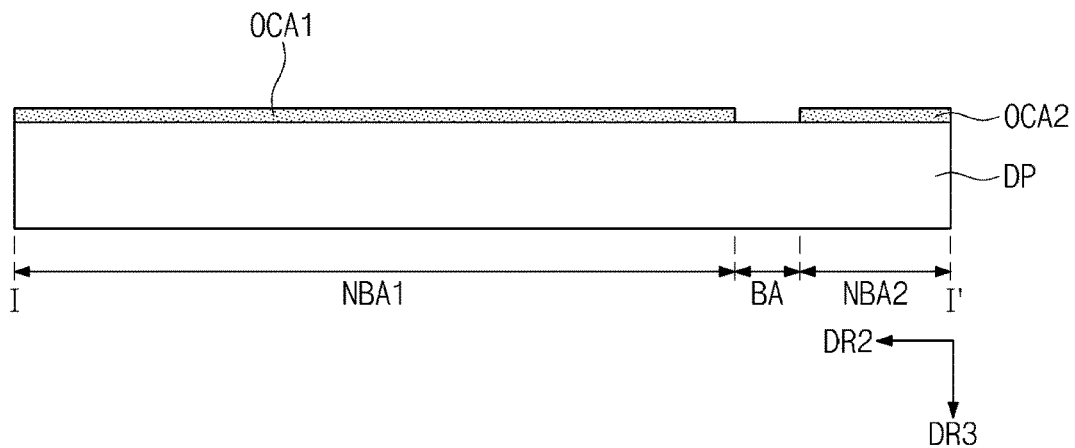
Figure 6E:
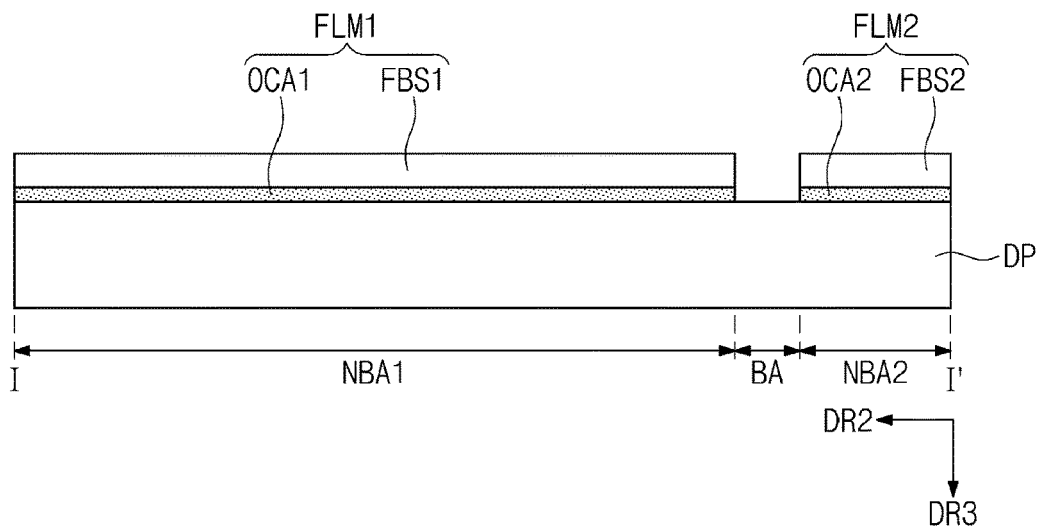

According to an embodiment, FIG. 6D illustrates a state in which the second liner LNR2 is removed from the first adhesive layer OCA1 and the second adhesive layer OCA2.

According to an embodiment, FIG. 6H illustrates a state in which the first protection film base FBS1 is attached onto the first adhesive layer OCA1, and the second protection film base FBS2 is attached onto the second adhesive layer OCA2.

In an exemplary embodiment, the first protection film FBS1 and the second protection film FBS2 may include identical or different materials. For example, the first protection film base FBS1 includes glass, and the second protection film base FBS2 includes polyimide.

According to an embodiment, the first adhesive layer OCA1 and the first protection film base FBS1 form the first protection film FLM1, and the second adhesive layer OCA2 and the second protection film base FBS2 form the second protection film FLM2.

Figure 6F:
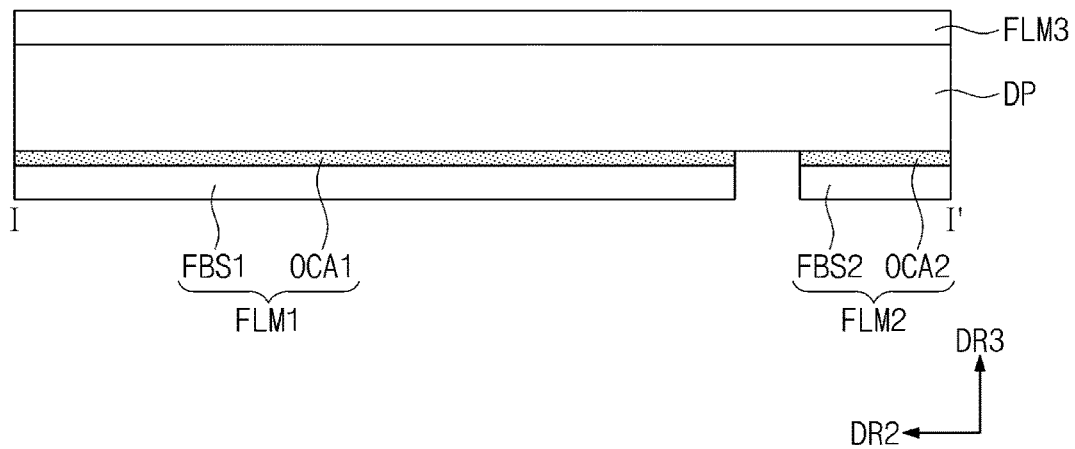

With reference to FIG. 6F, according to an embodiment, a third protection film FLM3 is disposed on the top surface of the display panel DP. The third protection film FLM3 prevents the top surface of the display panel DP from being damaged, and facilitates handling during the manufacturing process. Since such a third protection film FLM3 is removed in the manufacturing process, an adhesive force between the third protection film FLM3 and the display panel DP is not strong. In addition, the third protection film FLM3 includes an adhesive layer and a protection film base.

In another embodiment, the third protection film FLM3 is disposed on the top surface of the display panel DP before the first adhesive layer OCA1 and the second adhesive layer OCA2 are attached to the bottom surface of the display panel DP.

Figure 7:
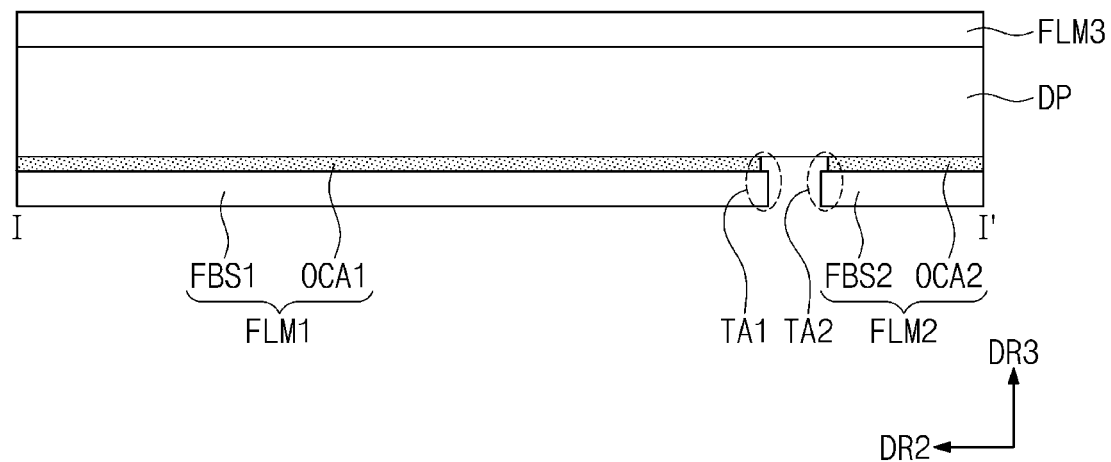
FIG. 7 is a cross-sectional view that illustrates how the first protection film and the second protection film are attached to the display panel.

FIG. 7 is a cross-sectional view that illustrates how the first protection film and the second protection film are attached to the display panel DP. As described with regard to FIGS. 6A to 6E, after the first adhesive layer OCA1 and the second adhesive layer OCA2 are attached to the display panel DP. the first protection film base FBS1 and the second protection film base FBS2 are respectively disposed on the first adhesive layer OCA1 and the second adhesive layer OCA2. Accordingly, a terminal end of the first adhesive layer OCA1 and a terminal end of the first protection film base FBS1 may be slightly misaligned in a first terminal area TA1. Similarly, a terminal end of the second adhesive layer OCA2 and a terminal end of die second protection film base FBS2 may be slightly misaligned in a second terminal area TA2.

According to an embodiment, FIGS. 8A to 8F illustrate processes for attaching the first protection film and the second protection film to the display panel DP.

Figure 8A:
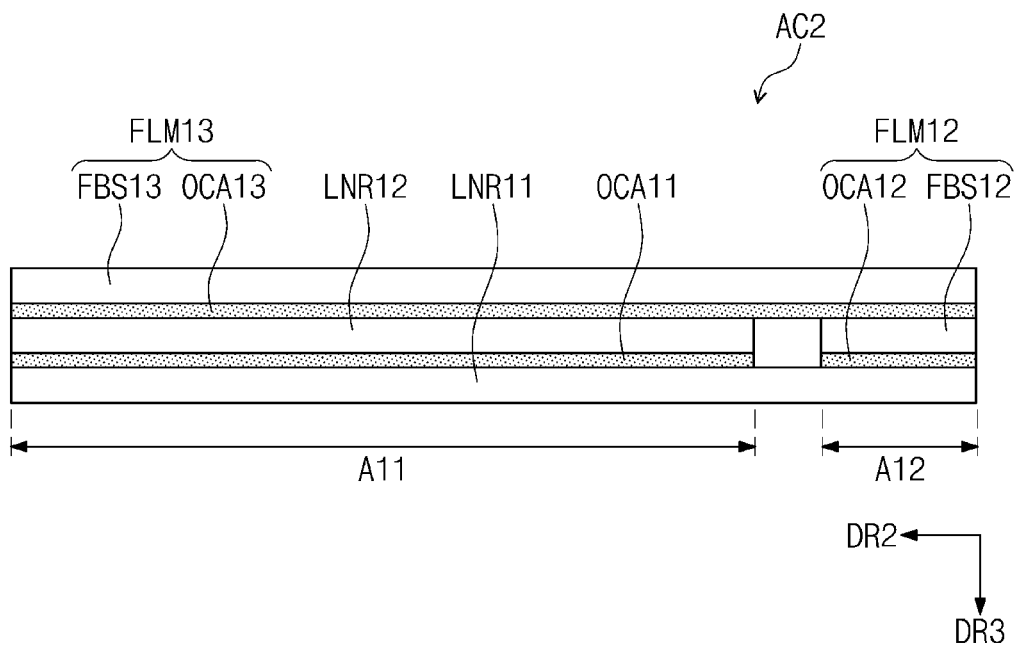
FIGS. 8A to 8F illustrate processes for attaching the first protection film and the second protection film to the display panel.

With reference to FIG. 8A, according to an embodiment, an adhesive component AC2, which is a display component, includes a first liner LNR11, a second liner LNR12, a first adhesive layer OCA11, a second protection film FLM12, and a third protection film FLM13. The second protection film FLM12 includes a second adhesive layer OCA12 and a second protection film base FBS12. The third protection film FLM13 includes a third adhesive layer OCA13 and a third protection film base FBS13.

According to an embodiment, the first liner LNR11 includes a first area A11 and a second area A12 that is separated front the first area A11 by a predetermined distance in the second direction DR2. The first area A11 corresponds to the first non-bendable area NBA1 illustrated in FIG. 6, and the second area A12 corresponds to the second non-bendable area NBA2 illustrated in FIG. 6.

According to an embodiment, the first adhesive layer OCA11 is disposed on the first area A11 on the first liner LNR11. The second adhesive layer OCA12 is disposed on the second area A12 on the first liner LNR11.

According to an embodiment, the second liner LNR12 is disposed on the first adhesive layer OCA11.

According to an embodiment, the second protection film base FBS12 is disposed on the second adhesive layer OCA12. The second adhesive layer OCA12 and the second protection film base FBS12 form the second protection film FLM12.

According to an embodiment, the third protection film FLM13 includes the third adhesive layer OCA13 and the third protection film base FBS13. The third adhesive layer OCA13 and the third protection film base FBS13 are disposed on the second liner LNR12 and the second protection film base FBS12.

According to an embodiment, the third protection film FLM13 is a carrier film that facilitates handling during the manufacturing process. Since the third protection film FLM13 is removed in the manufacturing process, adhesive forces between the third protection film FLM13, and the second liner LNR12 and the second protection film FBS12 are not strong. In addition, the first liner LR11 and the second liner LNR12 are also removed in the manufacturing process of the display device.

Figure 8B:
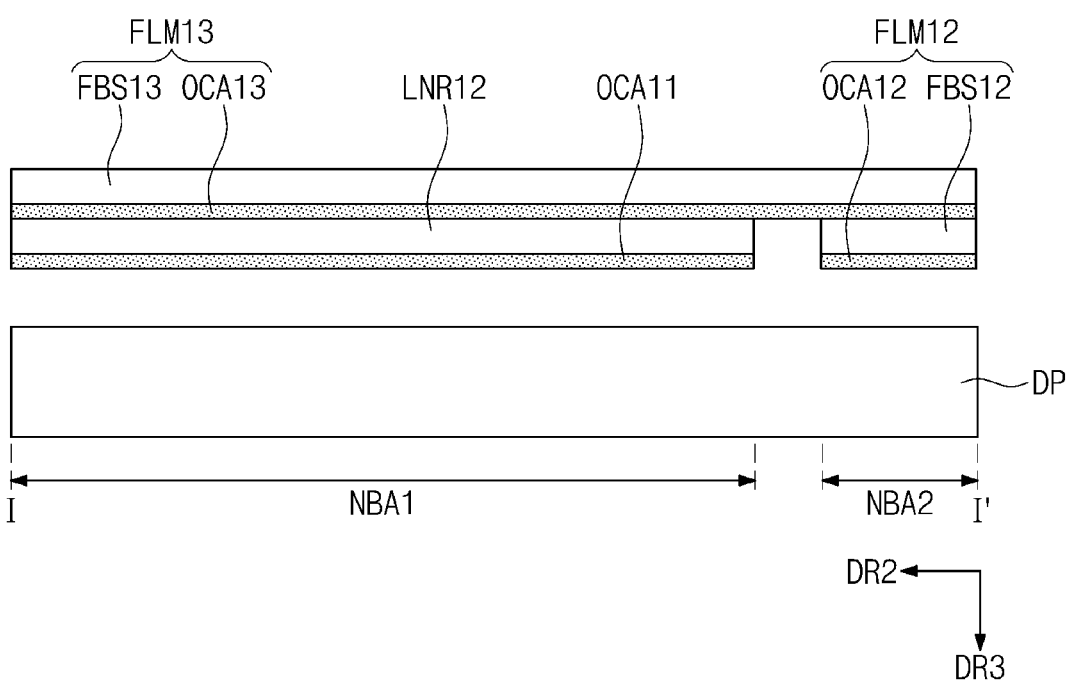

According to an embodiment, FIG. 8B illustrates a state in which the first liner LNR11 is removed from the first adhesive layer OCA11 and the second adhesive layer OCA12 to attach the first adhesive layer OCA11 and the second adhesive layer OCA12 to the display panel DP. The first adhesive layer OCA11 and the second adhesive layer OCA12 are aligned to respectively correspond to the first non-bendable area NBA1 and the second non-bendable area NBA2 of the display panel DP.

Figure 8C:
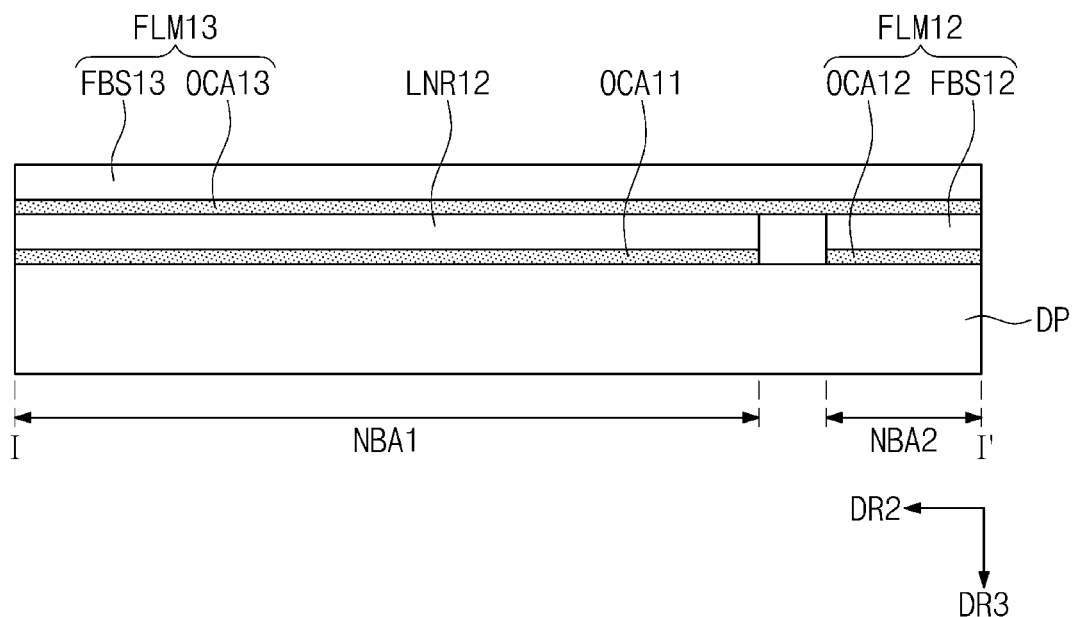

According to an embodiment, FIG. 8C illustrates a state in which the first adhesive layer OCA11 and the second adhesive layer OCA12 are attached to the display panel DP. The first adhesive layer OCA11 and the second adhesive layer OCA12 respectively correspond to the first non-bendable area NBA1 and the second non-bendable area NBA2 of the display panel DP.

Figure 8D:
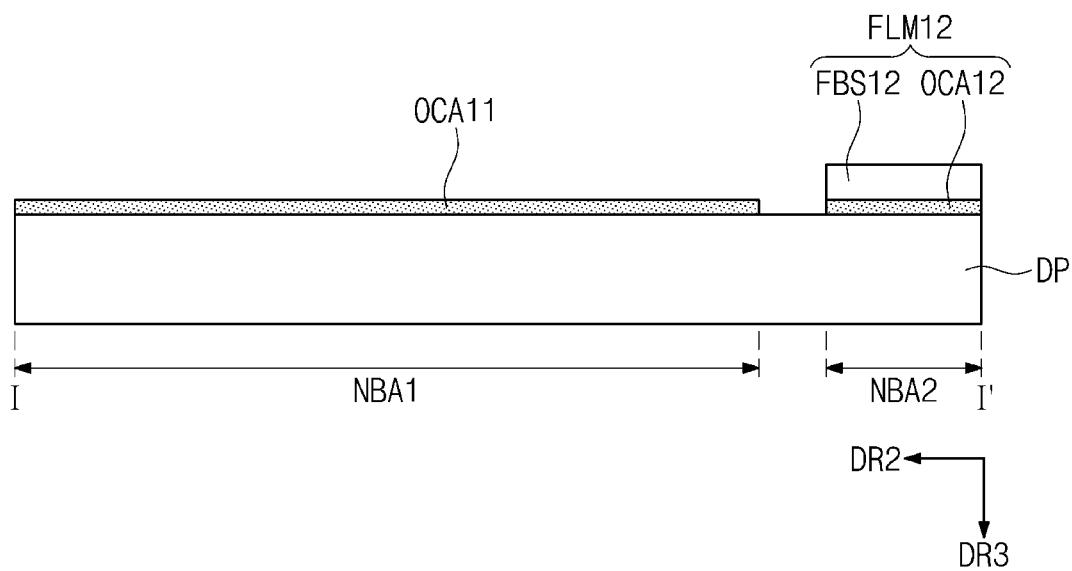

According to an embodiment, FIG. 8D illustrates a state in which the second liner LNR12 and the third protection film FLM13 are removed from the first adhesive layer OCA11 and the second adhesive layer OCA12.

Figure 8E:
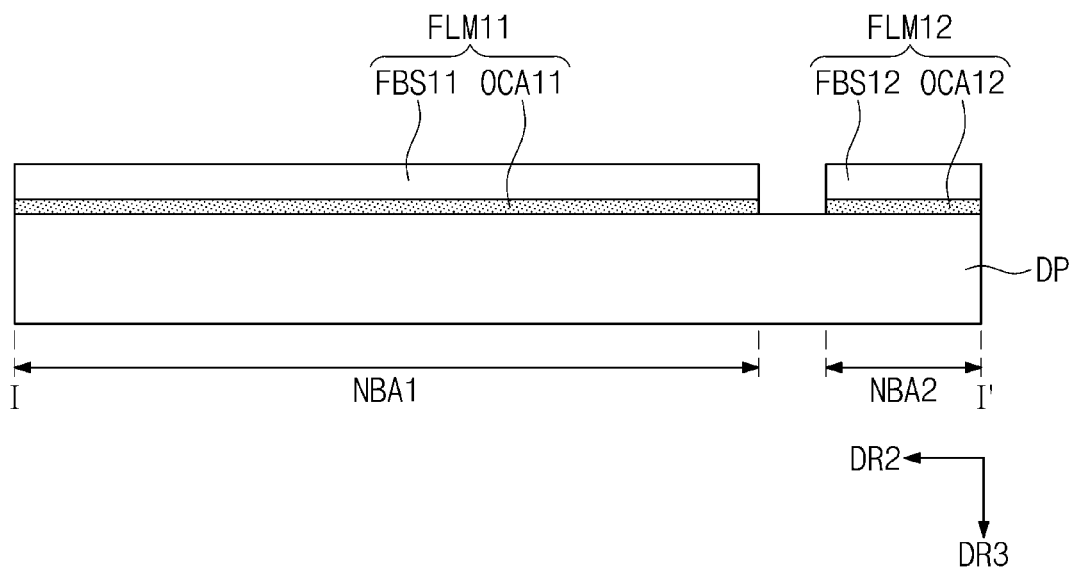

According to an embodiment, FIG. 8E illustrates a state in which the first protection film base FBS11 is attached onto the first adhesive layer OCA11.

In an exemplary embodiment, the first protection film base FBS11 and the second protection film base FBS12 may include identical or different materials. For example, the first protection film base FBS11 includes glass, and the second protection film base FBS12 includes polyimide. In particular, the first protection film base FLM11 is an ultra-thin glass with a thickness of 0.1 mm or less.

According to an embodiment, the first adhesive layer OCA11 and the first protection film base FBS11 form the first protection film FLM11.

Figure 8F:
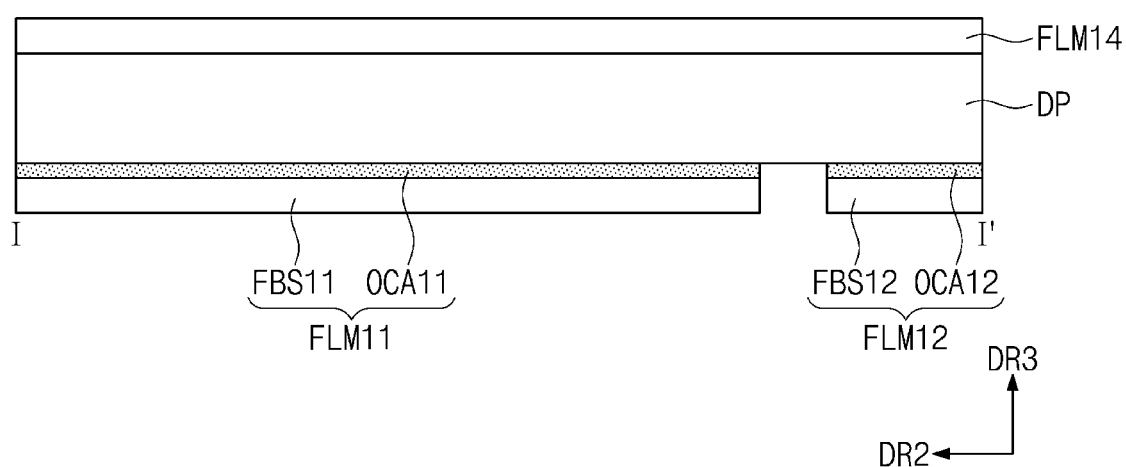

With reference to FIG. 8F, according to an embodiment, a fourth protection film FLM14 is disposed on the top surface of the display panel DP. The fourth protection film FLM14 prevents the top surface of the display panel DP from being damaged in the manufacturing process, and facilitates handling during the manufacturing process. Since such a fourth protection film FLM14 is removed in the manufacturing process, an adhesive force between the fourth protection film FLM14 and the display panel DP is not strong. In addition, the fourth protection film FLM14 includes an adhesive layer and a protection film base.

In another embodiment, the fourth protection film FLM14 is disposed on the top surface of the display panel DP, before the first adhesive layer OCA11 and the second adhesive layer OCA12 illustrated in FIG. 8B are attached to the bottom surface of the display panel DP.

Figure 9:
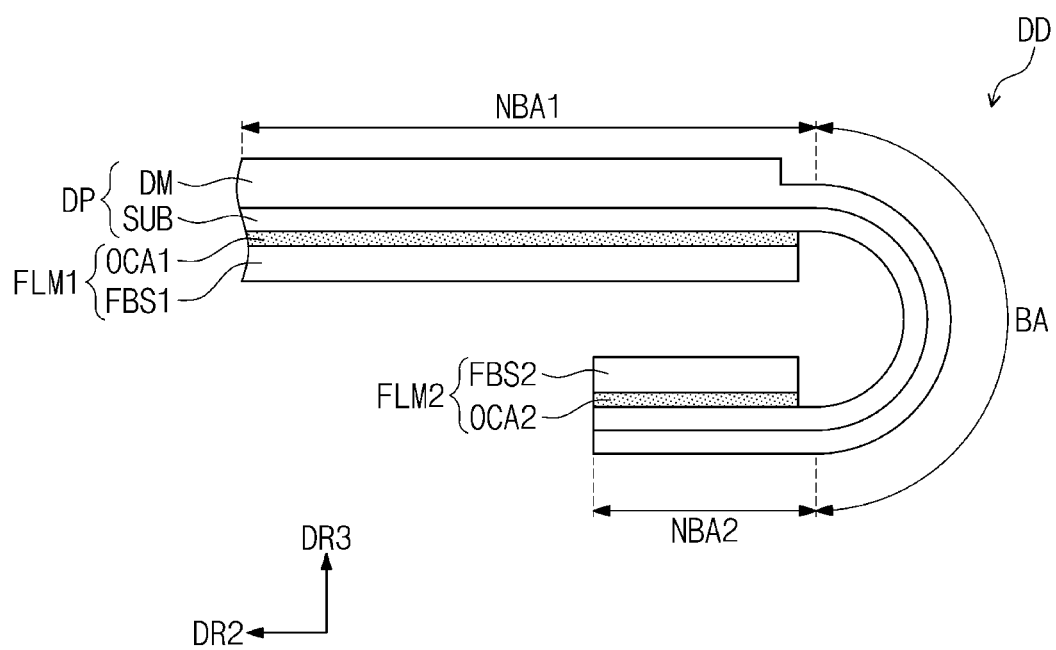
FIG. 9 is a cross-sectional view of a bent display panel of a display device according to an embodiment of the inventive concept.

FIG. 9 is a cross-sectional view of a bent display panel of a display device according to an embodiment of the inventive concept.

As illustrated in FIG. 9, according to an embodiment, a part, such as the circuit element layer CL shown in FIG. 2, of the substrate SUB of the display device DD and the display module DM is bent in the bendable area BA.

According to an embodiment, the first protection film base FBS1 of the first protection film FLM1 protects the bottom surface that corresponds to the light emitting element OLED in the display module DM of the display panel DP, and thus the first protection film base FBS1 is self-rigid. In an exemplary embodiment, the first protection film base FBS1 includes glass to protect the substrate SUB of the display module DM from an external shock.

In addition, according to an embodiment, the second protection film base FBS2 of the second protection film FLM2 is composed of a flexible or bendable polyimide. Accordingly, when the substrate SUB is bent, the second non-bendable area NBA of the substrate SUB moves flexibly to minimize occurrences of defects.

According to embodiments of the inventive concept, a display device having such a configuration includes a protection film in the bottom of the display panel to protect the bottom surface of the display panel. Furthermore, the protection film includes a thin and solid material such as an ultra-thin glass to protect the display panel.

While embodiments of the inventive concept has been described with reference to exemplary embodiments thereof, it will be clear to those of ordinary skill in the art to which the disclosure pertains that various changes and modifications may be made to exemplary embodiments without departing from the spirit and technical area of the inventive concept as defined in the appended claims and their equivalents.

Thus, the scope of embodiments of the inventive concept shall not be restricted or limited by the foregoing description, but be determined by the broadest permissible interpretation of the following claims.

What is claimed is:

1. A method of manufacturing a display device, the manufacturing; method comprising:
   providing a display panel that includes a first non-bendable area, a second non-bendable area, and a bendable area;
   disposing a first adhesive layer on a second surface of the display panel at a position that corresponds to the first non-bendable area,
   disposing a second adhesive layer on the second surface of the display panel at a position that corresponds to the second non-bendable area,
   wherein disposing the first adhesive layer and disposing the second adhesive layer comprises:
      providing a display component that includes a first liner that includes a first area, a second area separate from the first area by a predetermined distance, and a third area between the first area and the second area, wherein the first area and the second area are directly connected to each other through the third area,
      disposing the first adhesive layer on the first area of the first liner,
      disposing the second adhesive layer on the second area of the first liner, and
      disposing a second liner on the first adhesive layer and the second adhesive layer;
   disposing a first protection film base on the first adhesive layer,
   disposing a second protection film base that differs from the first protection film base on the second adhesive layer;
   disposing a third protection film on a first surface of the display panel that is opposite ter the second surface,
   wherein the first non-bendable area and the second non-bendable area are separated from each other with the bendable area in between, and the third protection film covers the first non-bendable area, the second non-bendable area, and the bendable area; and
   removing the third protection film front the first surface of the display panel during a subsequent manufacturing process of the display panel.

2. The manufacturing method of claim 1, wherein the first protection film base comprises glass.

3. The manufacturing method of claim 1, wherein the second protection film base comprises polyimide.

4. The manufacturing method of claim 1, further comprising:
   removing the first liner of the display component;
   attaching the first adhesive layer and the second adhesive layer to the second surface of the display panel; and
   removing the second liner of the display component.

5. The manufacturing method of claim 4, wherein the first adhesive layer and the second adhesive layer include an identical material.

* * * * *